US006059069A

United States Patent [19]

Hughes, II

[11] Patent Number: 6,059,069

[45] Date of Patent: May 9, 2000

[54] LOUDSPEAKER WAVEGUIDE DESIGN

[75] Inventor: Charles Emory Hughes, II, Meridian, Miss.

[73] Assignee: Peavey Electronics Corporation, Meridian, Miss.

[21] Appl. No.: 09/382,817

[22] Filed: Aug. 25, 1999

Related U.S. Application Data

[60] Provisional application No. 60/123,303, Mar. 5, 1999.

[51] Int. Cl.[7] ...................................................... H05K 5/00

[52] U.S. Cl. .......................... 181/152; 181/152; 181/148; 181/159; 181/157; 181/175; 181/177; 181/182; 181/187; 181/192; 181/195; 381/337; 381/339; 381/340

[58] Field of Search .................................... 181/152, 148, 181/159, 157, 175, 177, 182, 187, 192, 195; 381/337, 339, 340

[56] References Cited

U.S. PATENT DOCUMENTS

| | | | |
|---|---|---|---|
| 2,203,875 | 6/1940 | Olson . | |
| 2,338,262 | 1/1944 | Salmon . | |
| 2,690,231 | 9/1954 | Levy et al. . | |
| 4,071,112 | 1/1978 | Keele, Jr. . | |
| 4,171,734 | 10/1979 | Peveto et al. . | |
| 4,176,731 | 12/1979 | Sinclair . | |
| 4,187,926 | 2/1980 | Henricksen et al. . | |
| 4,308,932 | 1/1982 | Keele, Jr. . | |
| 4,324,313 | 4/1982 | Nakagawa . | |
| 4,369,857 | 1/1983 | Frazer et al. | 181/159 |
| 4,465,160 | 8/1984 | Kawamura et al. . | |
| 4,469,921 | 9/1984 | Kinoshita . | |
| 4,635,749 | 1/1987 | Tattersall . | |
| 4,685,532 | 8/1987 | Gunness . | |
| 5,020,630 | 6/1991 | Gunness . | |
| 5,233,136 | 8/1993 | Hamada | 181/152 |
| 5,285,025 | 2/1994 | Yoshioka . | |
| 5,750,943 | 5/1998 | Heinz . | |
| 5,925,856 | 7/1999 | Meyer et al. | 181/152 |

FOREIGN PATENT DOCUMENTS

| | | |
|---|---|---|
| 58-114694 | 7/1983 | Japan . |

*Primary Examiner*—Robert E. Nappi
*Assistant Examiner*—Edgardo San Martin
*Attorney, Agent, or Firm*—Watson Cole Grindle Watson, P.L.L.C.

[57] ABSTRACT

A loudspeaker horn has straight wall section and a curved wall section. The straight wall section has diverging walls defining a coverage angle and the curved wall portion is connected to the straight wall portion at a point tangent thereto, and has a proximal end disposed perpendicular to the plane of the throat entrance. At least one coverage angle in orthogonal planes has a common apex in the plane of the throat entrance and along the horn axis.

12 Claims, 9 Drawing Sheets

LOUDSPEAKER WAVEGUIDE DESIGN

CROSS-REFERENCE TO RELATED APPLICATION

This application is related to and claims the benefit of U.S. Provisional Application Ser. No. 60/123,303 filed Mar. 5, 1999, the teachings of which are incorporated herein by reference.

BACKGROUND OF THE INVENTION

The invention relates to loudspeakers and in particular to a loudspeaker horn having selectable directivity in different planes and a common point at which the wavefront appears to originate in each plane.

Loudspeaker horns are well known and are used to both increase speaker output by appropriate loading of the driver and for directivity control. Appropriate loading can improve power handling and efficiency of modern compression drivers. However, directivity problems remain. To alleviate such problems, some known horn designs employ essentially separate but joined sections. In such arrangements, the first section has a cross section area that expands exponentially and the second area has constant expansion like a cone. Such combined horns have good loading and directivity over a wide range of frequencies. The design, however, is complicated.

Another arrangement for controlling directivity employs the so called Manta-Ray design which provides good loading and directivity, but exhibits severe astigmatism in the curvature of the wavefront produced by the horn. Briefly stated, the radius of curvature of a wavefront is different in the horizontal and vertical planes. The wavefront appears offset and does not seem to originate from the same point. Astigmatism can adversely affect the sound when more than one horn is employed in an array. In addition to astigmatism, such horns tend to distort the signal at high sound pressure levels and can produce reflections and diffraction which complicates the predictability of the horn operation.

SUMMARY OF THE INVENTION

The present invention is based upon the discovery that a horn having first and second straight side wall portions in orthogonal planes can be joined to a driver by a connecting section which is tangent to the straight wall of the horn and perpendicular to the throat entrance of the horn and wherein the side walls each have an apex co-located in the plane of the throat entrance.

DETAILED DESCRIPTION OF THE INVENTION

Figure 1:
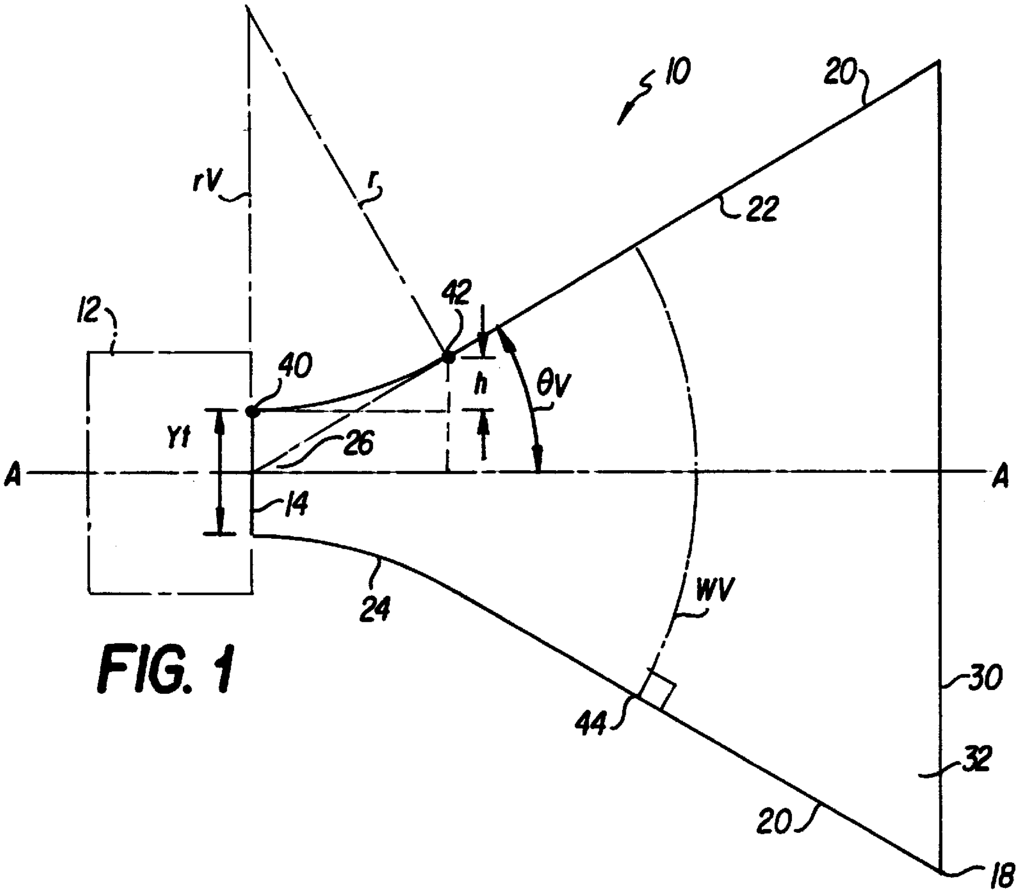
FIG. 1 is a schematic side sectional view of a loud speaker employing a horn according to the invention.
Figure 2:
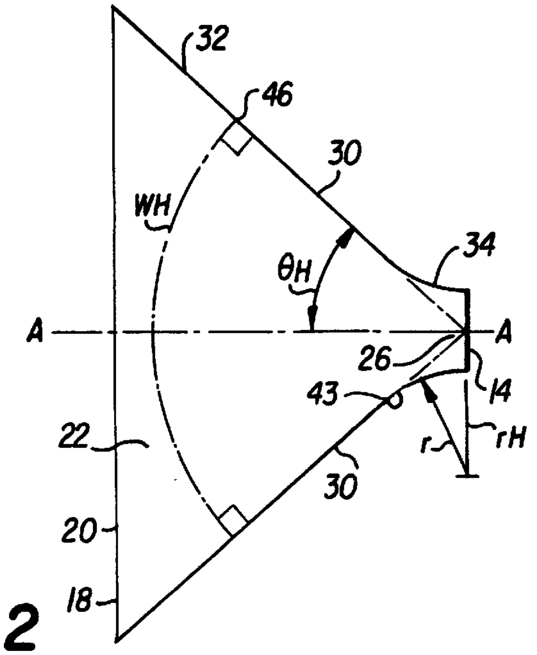
FIG. 2 is a schematic sectional top view of the horn of FIG. 1.

FIGS. 1&2 schematically illustrate the geometry of a horn 10 (sometimes hereinafter referred to as acoustic waveguide or simply as a waveguide) in accordance with the present invention. In the illustration, the horn 10 is connected to a driver 12. The horn 10 has a throat entrance or inlet end 14, an outlet or exit end 18, an axis A and paired sidewalls 20 and 30 each having a respective straight line wall portion 22 and 32 disposed at a corresponding horizontal horn angle θH and a vertical horn angle θV with respect to the central or horn axis A. The horn 10 has curved wall portions 24 and 34 which extend from the respective straight line portions 22 and 32 to the throat entrance 14. The sidewalls 30, as illustrated, extend in a generally vertical direction; and the side walls 20 are orthogonal thereto. The horn angles θH and θV for the sidewalls 20 and 30 are, in accordance with an exemplary embodiment the invention different, so that the horizontal and vertical coverage of the horn is different. It should be understood that the horn angle may be the same in both directions As can be seen in FIGS. 1&2, the vertical horn angle θV and horizontal θH have a common apex 26 at the throat entrance 14. The horn 10 produces a corresponding wavefront WV for the vertical plane and a wavefront WH for the horizontal plane each of which appears to emanate or originate at the same point, namely the apex 26.

The curved sections 24 and 34 have a radius of curvature rv and $r_H$, respectively, and extend from a point 40 at the horn inlet end 14 to a point 42 at the beginning of the straight wall section 22 and 32. According to the invention, the curved sections 24 and 34 are perpendicular to the horn throat entrance 14 at point 40 and are tangent to the corresponding straight wall portions 22 and 32 at the points 42 and 43, respectively. The arrangement illustrated produces the horizontal wavefront WH and the vertical wavefront WV each of which having respective end points 44 and 46 are perpendicular to the sidewalls 22 and 32 of the horn 10, as shown in FIGS. 1&2.

Figure 3:
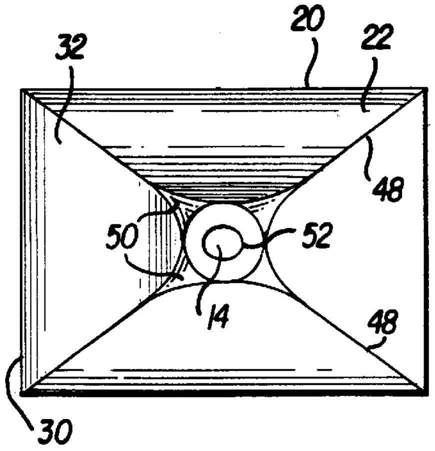
FIG. 3 is a front elevation of the horn shown in FIG. 1.

The respective sidewall portions 20 and 30 are joined along respective corner portions 48 which radiate outwardly as shown in FIG. 3. The corners 48 converge at elliptical corner portions 50 and terminate as a circular opening 52 forming the throat entrance 14.

The arrangement shown in FIGS. 1–3 forms an acoustic waveguide for controlling loading and directivity with substantially no astigmatism resulting from the geometry.

The following terms are listed herein and below and are shown in FIG. 1.

r=radius of connecting arc $y_t$=diameter of throat entrance $r_H$=radius of horizontal plane connecting arc $r_v$=radius of vertical plane connection arc θH=horizontal coverage half-angle θV=vertical coverage half-angle To analyze the design, equations describing the cross sectional area expansion within the throat section 24 and 34 were developed. A relationship between known design parameters and the connecting arc, r, were also developed. To simplify matters, the axisymmetric, or circular case is described below.

$$r^2 + a^2 = \left(r + \frac{y_t}{2}\right) \qquad 1 + \frac{a^2}{r^2} = \left(\frac{r + \frac{y_t}{2}}{r^2}\right)^2 \tag{1}$$

-continued $$1+\tan^2\theta=\left(\frac{r+\frac{y_t}{2}}{r^2}\right)^2 \qquad r=\frac{y_t}{2}\left(\sqrt{1+\tan^2\theta}-1\right)$$

Equation (1) shows the relationship between the radius of the connecting arc, r, the throat diameter $y_t$, and the design coverage angle, θ.

To derive an expression for the height, or diameter, within the throat section, let h be the incremental height difference from the throat entry diameter, $y_t$, and the waveguide boundary.

$$y=y_t+2h \qquad (r-h)^2=r^2-x^2 \tag{2}$$

$$h=r-\sqrt{r^2-x^2} \qquad y=y_t+2\left(r-\sqrt{r^2-x^2}\right)$$

Equation (2) gives an expression for the height within the throat section of the waveguide. The cross sectional area expansion may be defined as:

$$S=\pi\left(\frac{y}{2}\right)^2=\pi\left(\frac{y_t}{2}+r-\sqrt{r^2-x^2}\right)^2 \tag{3}$$

This reduces to $$S=\pi\left(x^2-(y_t+2r)\sqrt{r^2-x^2}+y_t\left(\frac{y_t}{4}+r\right)\right)$$

$$S=Ax^2+B\sqrt{r^2-x^2}+C$$

$$A=\pi \quad B=-\pi(y_t+2r) \quad C=\pi y_t\left(\frac{y_t}{4}+r\right)$$

Equation (3), while not in the classical form of a quadratic equation, does possess the traits of such an expression in that it has an $x^2$, and x and a constant term. As such, the waveguide design is sometimes referred to herein as a Quadratic Throat (QT) waveguide.

For non-axisymmetric cases the expansions do not lend themselves to this level of algebraic reduction. Hence, their expansion is given by:

$$S=\left(y_t+2\left(r_H-\sqrt{r_H^2-x^2}\right)\right)*\left(y_t+2\left(r_V-\sqrt{r_V^2-x^2}\right)\right) \tag{4}$$

From equation (1)

$$r_H=\frac{y_t}{2}\left(\sqrt{1+\tan^2\theta_H}-1\right) \qquad r_V=\frac{y_t}{2}\left(\sqrt{1+\tan^2\theta_V}-1\right)$$

Equation (4) is the expansion for the rectangular case that was used for the development of exemplary waveguides presented herein.

Figure 4:
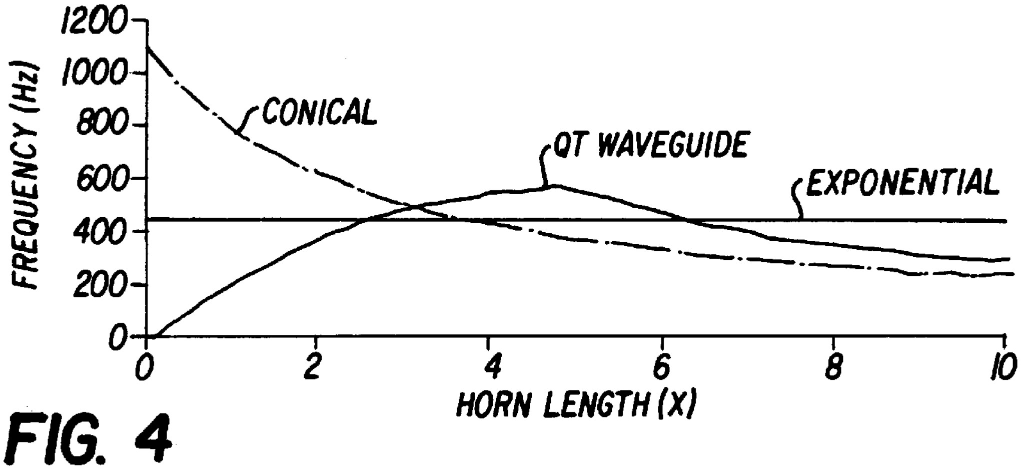
FIG. 4 is a comparative plot of frequency response V horn length for various horn arrangements.

A suitable method for analyzing the horn loading compares the instantaneous flare rate of an arbitrary shape horn to that of a classical exponential flare rate. The instantaneous flare rate $f_c$ is determined for any point along the length of the horn. The instantaneous flare rate $f_c$ can be graphed against the horn length. FIG. 4 illustrates a graphical representation comparing an exponential horn, a conical horn and an axisymmetric Quadratic Throat waveguide of the invention. For this comparison, the throat entry and horn length are the same for all three. The mouth exit is the same for the exponential and conical horns. The mouth of the QT waveguide is slightly smaller than the other horns. It is smaller by the exact dimension of the throat entry. This is an artifact of the nature of this type of horn.

As would be expected, because its flare rate is the reference, the exponential horn has a constant value of $f_c$.

The conical horn can be seen to have an initial value at the throat entry. This value steadily decreases until it reaches its minimum value at the mouth. This is indicative of the gradual decrease in the acoustic resistance of conical horns.

The QT waveguide presents a different loading characteristic. It has an initial value of 0 Hz at the throat. This can be attributed to the fact that at the throat entry, the walls 24 have no flare, i.e. they are normal to the plane of the throat entry 14. The value of $f_c$ steadily increases until it reaches its maximum value at the point 42 where the curved sections 24 join the straight wall sections 22. From this point, it steadily decreases in the same manner as that of the conical horn. This provides a good indication as to the loading properties of the QT waveguide.

Figure 5:
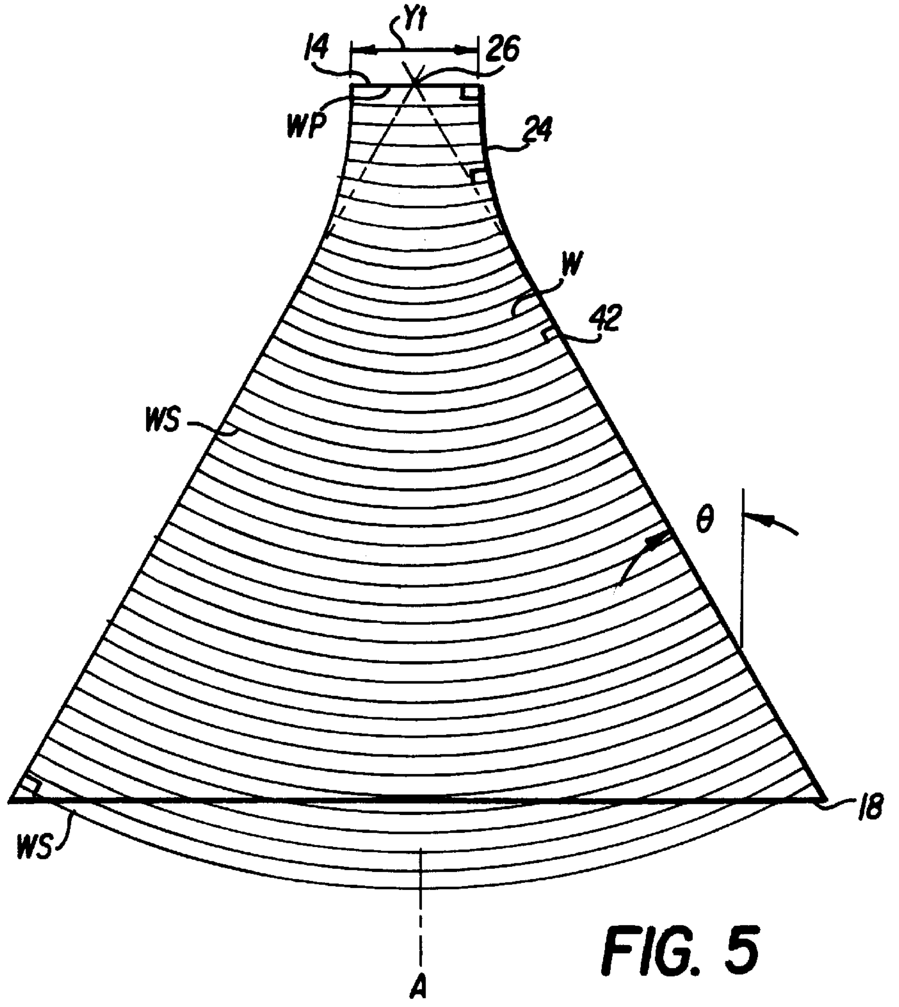
FIG. 5 is an illustration of wavefront transformation and propagation through an exemplary horn or acoustic waveguide according to the invention.

The development of the proper wavefront W shape is important for the directivity response to be as intended. The main requirement is for the wavefront to remain normal to the waveguide boundary at all points along the boundary. This means the waveguide must effectively transform the planar wavefront WP, presented to the throat entry 14 by the driving unit 12, to a spherical wavefront along the waveguide 10 to the exit end 18 as shown in FIG. 5. The wavefront W is shown at regularly spaced intervals to depict its transformation and development from the planar form WP to the spherical form WS. The spherical wavefront is achieved at the point 42 where the waveguide 10 transitions from the throat section along the curved portion 24 to the straight wall section 22. From this point forward, the spherical wavefront WS progresses toward the exit or mouth 18 of the waveguide. The radius of curvature of the wavefront is equal to its distance from the point 26 in the center of the throat entry 14.

Two existing horns were redesigned using the QT waveguide technique. The new waveguides had the same coverage angles and walls in the outer section as the existing horns. The only major difference being that of the initial throat section. The first existing horn has a 0.875" entrance into an exponential throat section. This throat section joins to a conventional, radial, constant directivity straight wall section. The second horn has a 2.0" entrance into a conventional straight wall section. This section is maintained until the last ¼ of the horn length. At this point, secondary flanges are added to minimize beamwidth narrowing prior to the horn losing its directivity control in the lower frequency region. It is otherwise a conventional straight wall horn. It should be noted that the waveguide designed from the second horn was done with a 1.6" throat entry. This smaller entrance may account for some of the increased output as well as its improved directivity response in the high frequency region. It otherwise should have no effect on the comparisons depicted hereinafter.

The new waveguides were compared to the existing horn designs. Amplitude response, impedance, harmonic distortion at different power levels and directivity response measurements were made on the existing horns and the new waveguides. The same drive units were used for each comparable horn so as to minimize any measurement errors. Graphs of these measurements for the 0.875" throat entry devices are shown in FIGS. 6A–B–9A–C. Graphs of these measurements for the larger throat entry devices are shown in FIGS. 10A–B–13A–C. All of the measurements in these graphs are shown with ⅓ octave smoothing.

Figure 6A:
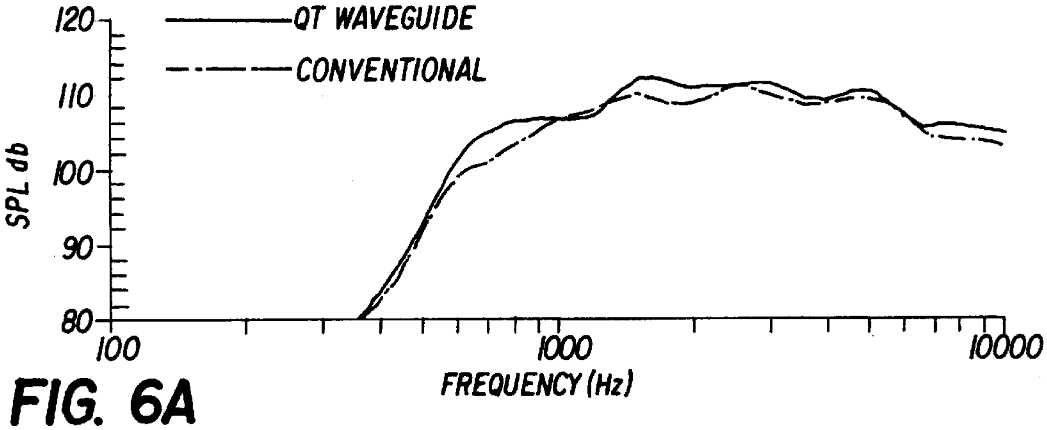
FIGS. 6A–6B–13A–13C are comparative plots of parameters of conventional horn and parameters of the horn according to the invention.
Figure 6B:
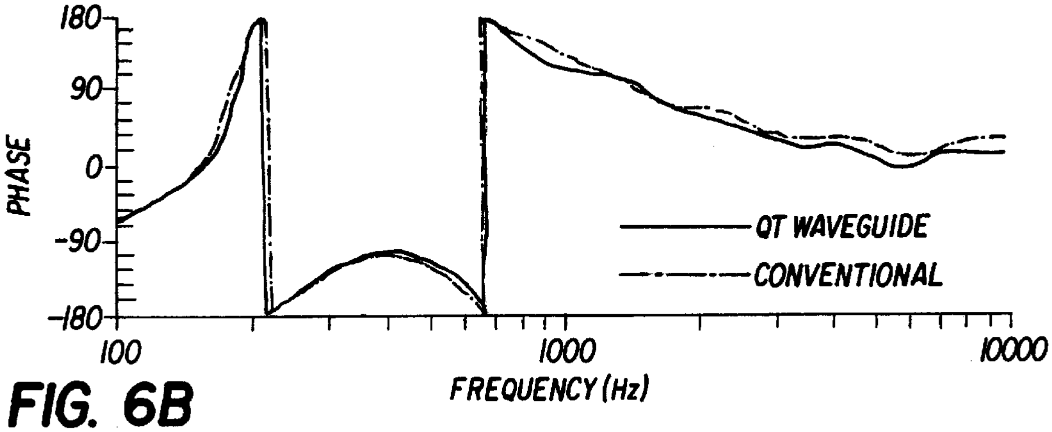
Figure 7A:
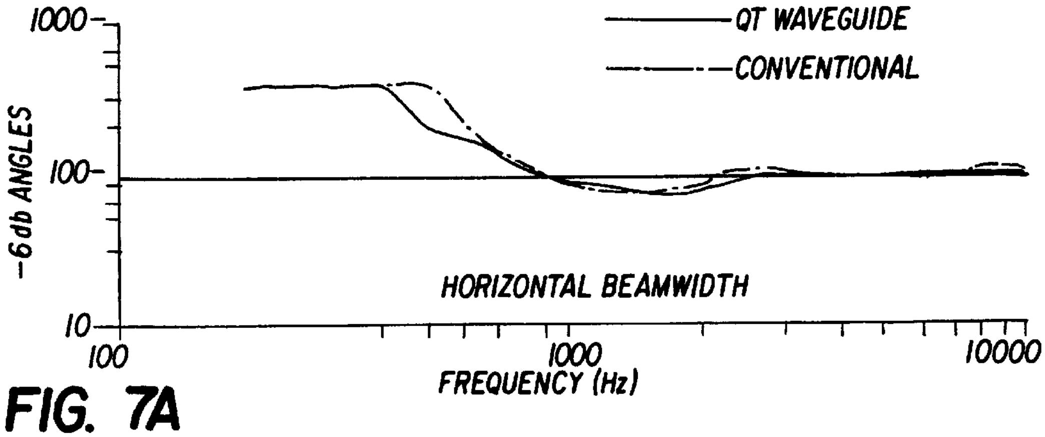
Figure 7B:
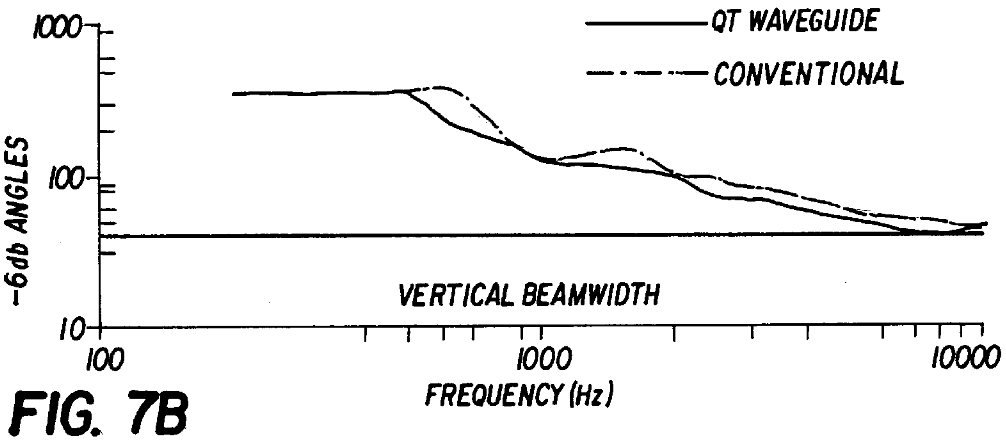
Figure 8A:
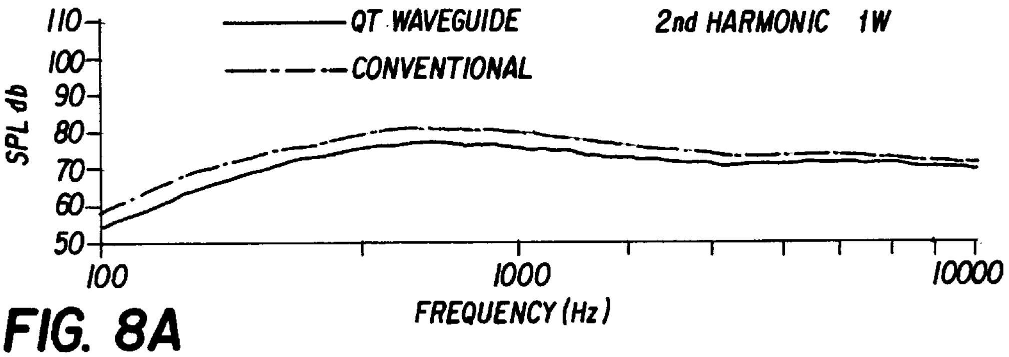
Figure 8B:
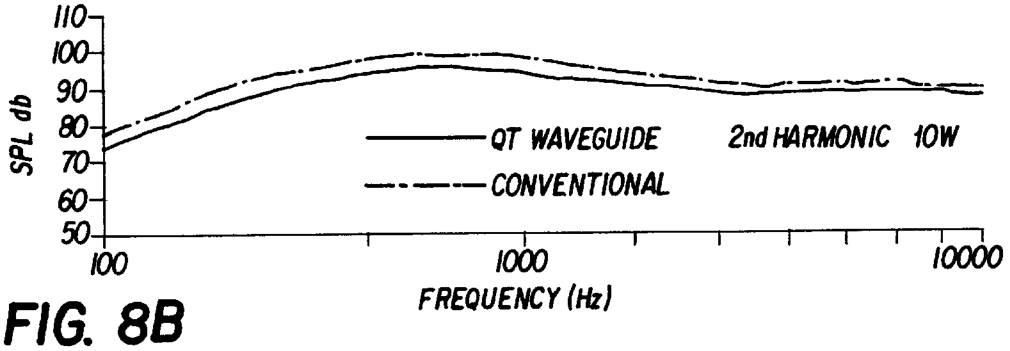
Figure 8C:
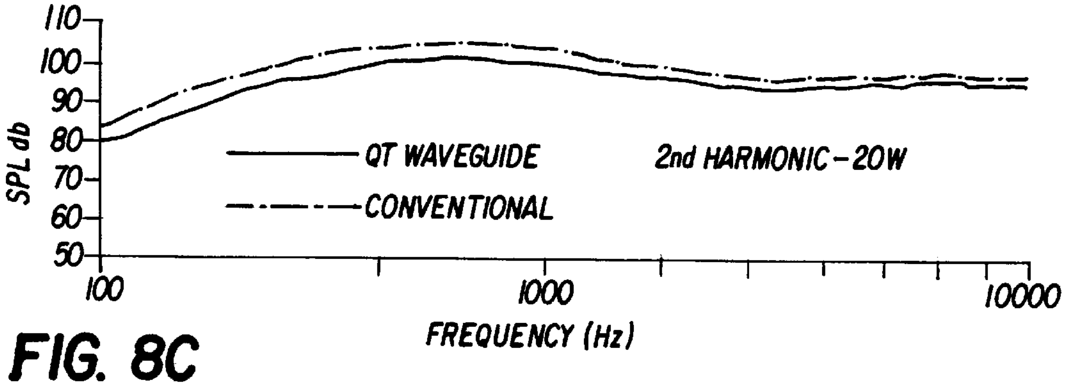
Figure 9A:
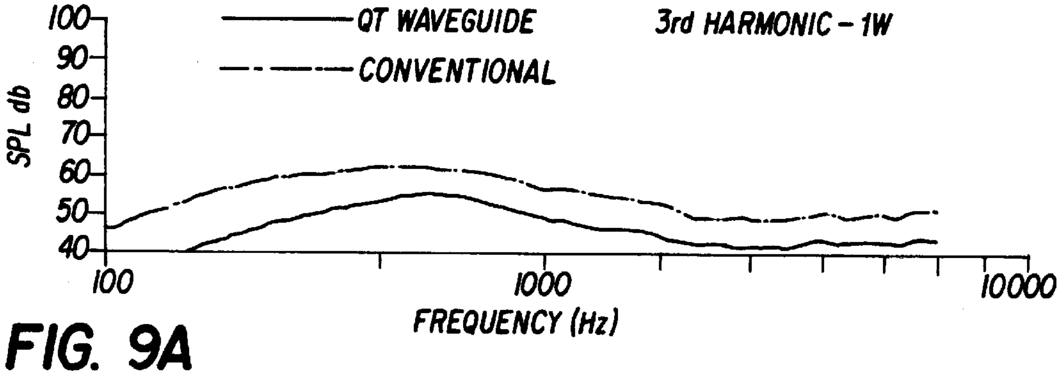
Figure 9B:
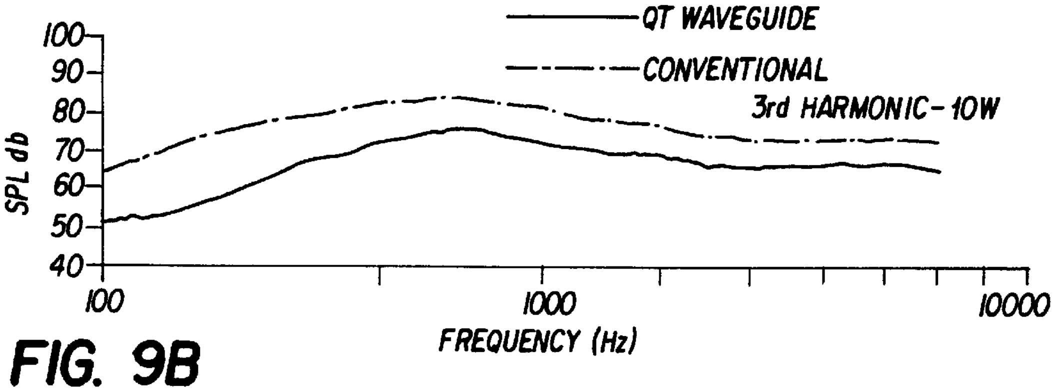
Figure 9C:
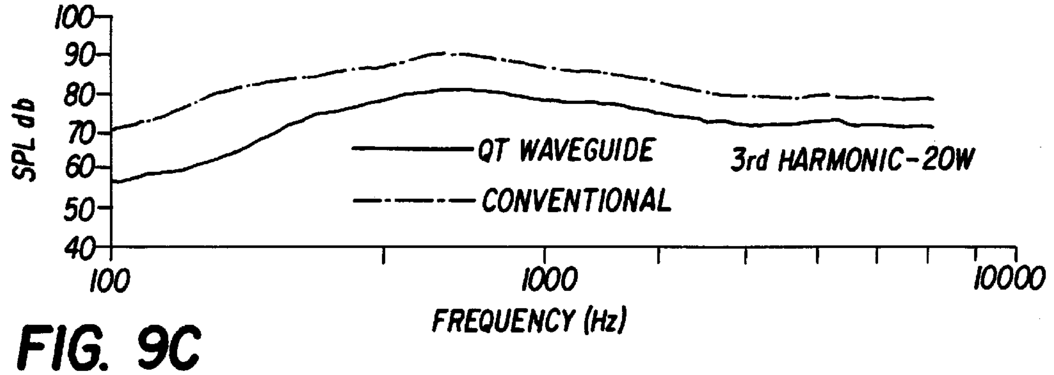

FIGS. 6A &6B show the amplitude response and phase response of the respective devices. The two devices are comparable in this area. FIGS. 7A–B show the horizontal and vertical beamwidth measurements respectively. The horizontal beamwidth of the two is almost identical.

However, the vertical beamwidth of the QT waveguide is much closer to its intended coverage angle than the conventional design. FIGS. 8A–C & 9A–C present $2^{nd}$ & $3^{rd}$ harmonic distortion, respectively at different power levels. It is clear that the QT waveguide has lower distortion. The $2^{nd}$ harmonic distortion is 3.5–4 dB lower while $3^{rd}$ harmonic distortion is reduced in excess of 9 dB over the conventional horn.

Figure 10A:
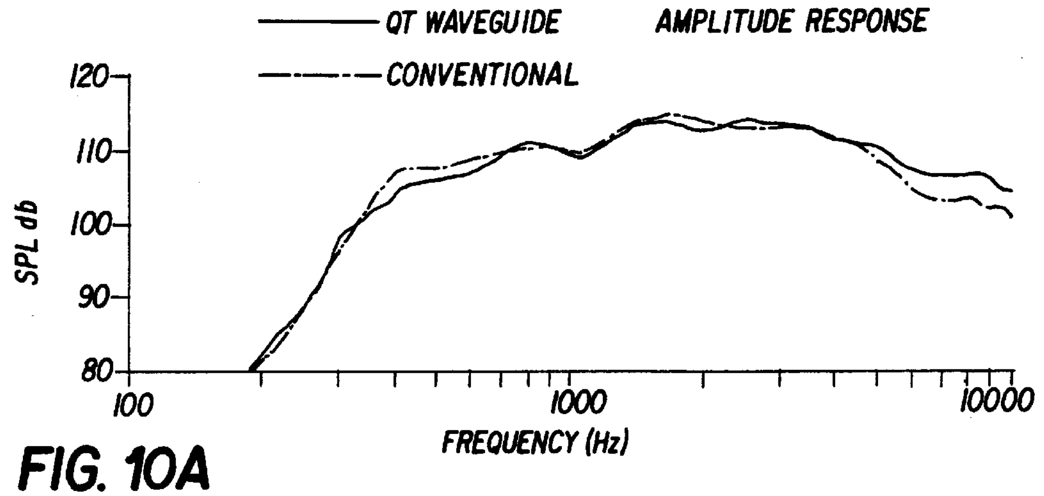
Figure 10B:
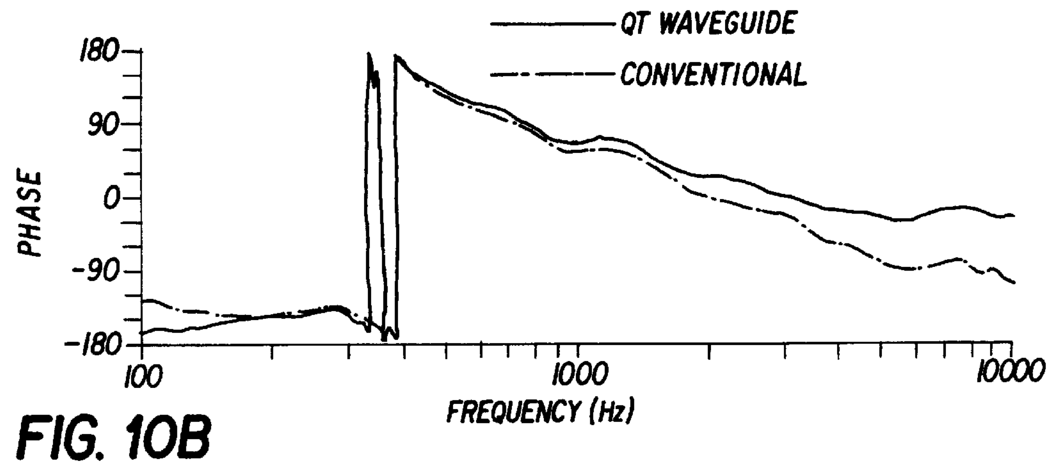
Figure 11A:
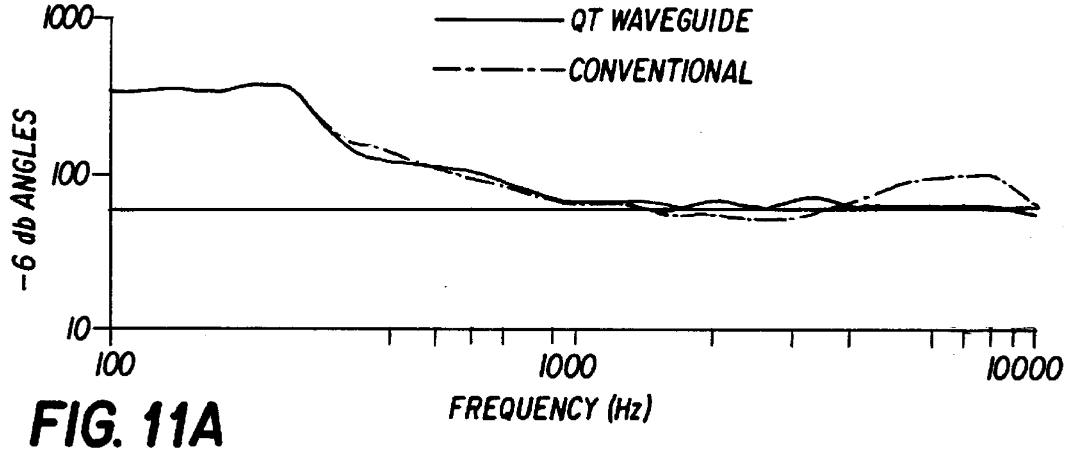
Figure 11B:
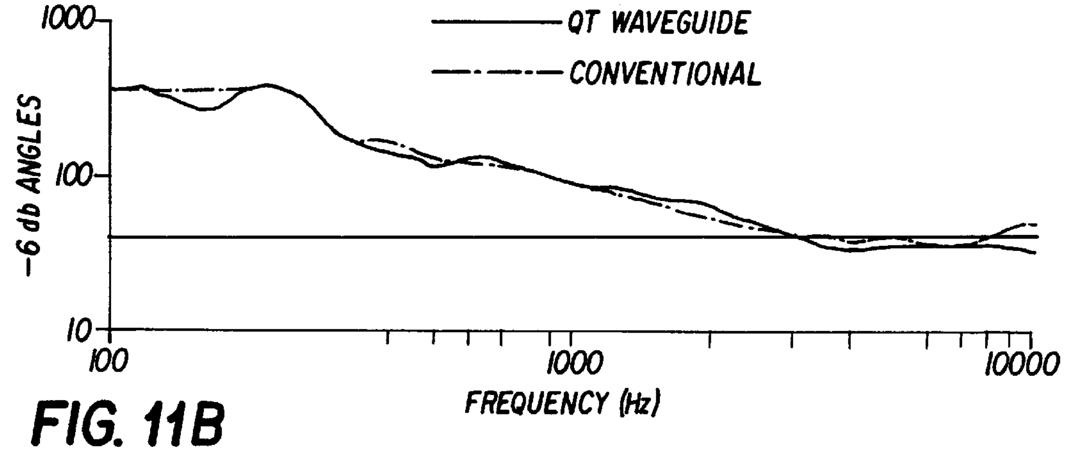
Figure 12A:
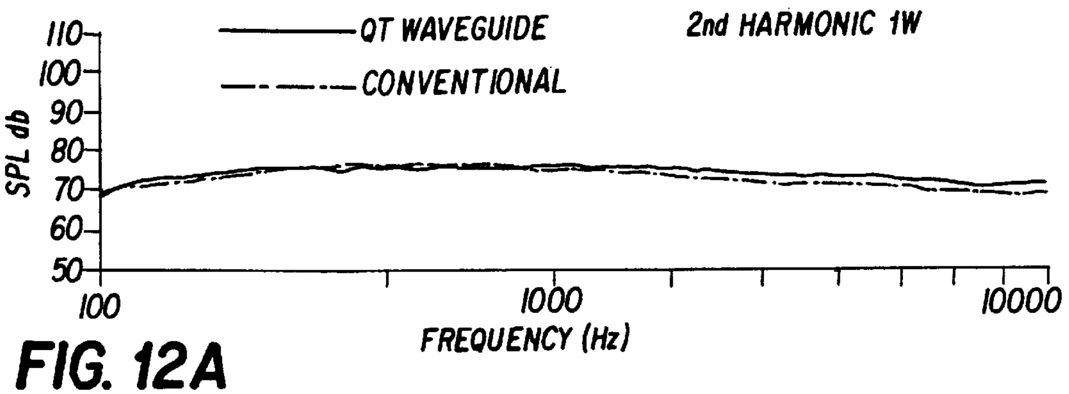
Figure 12B:
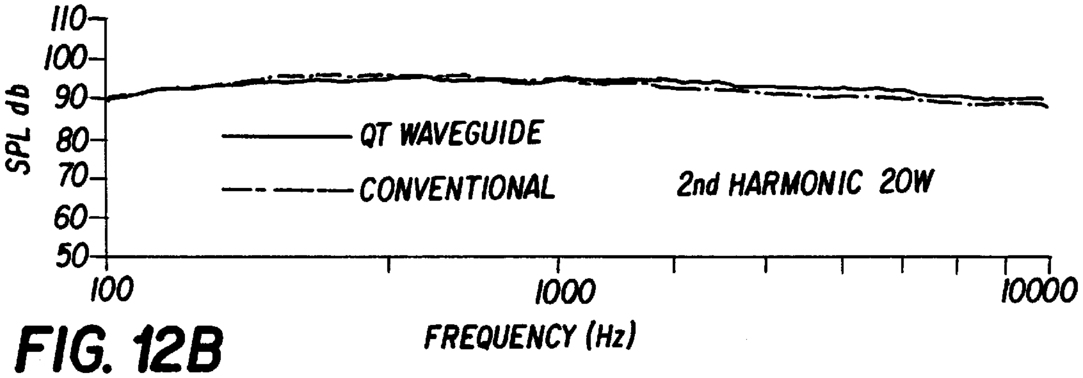
Figure 12C:
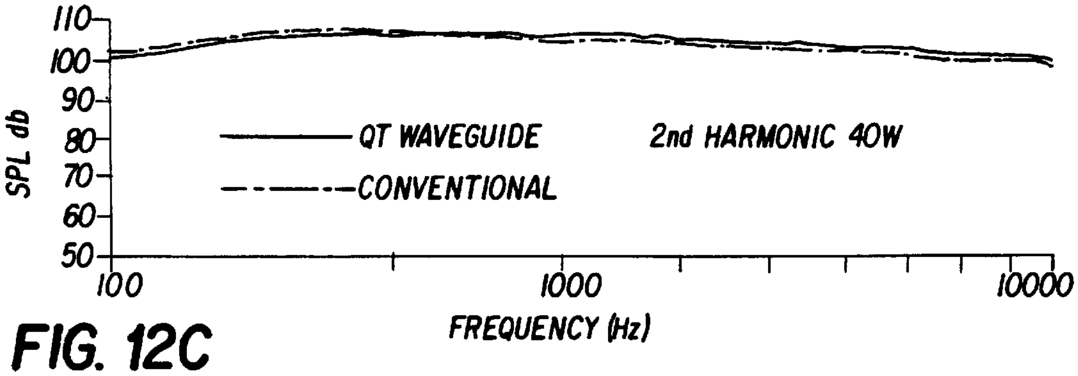
Figure 13A:
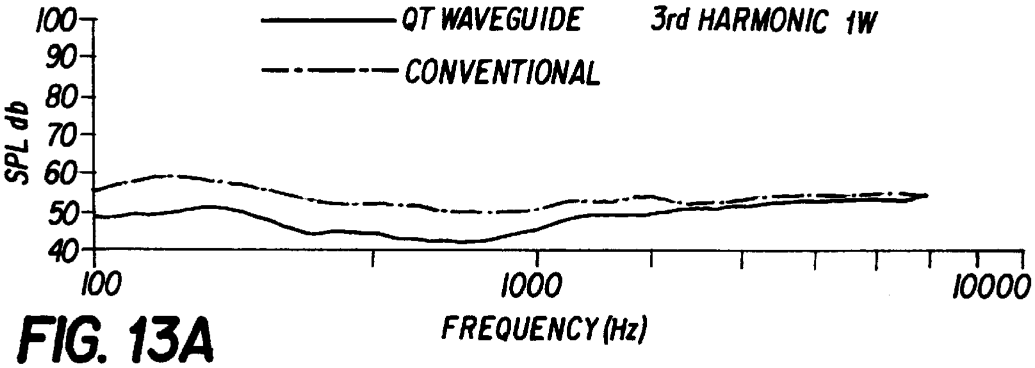
Figure 13B:
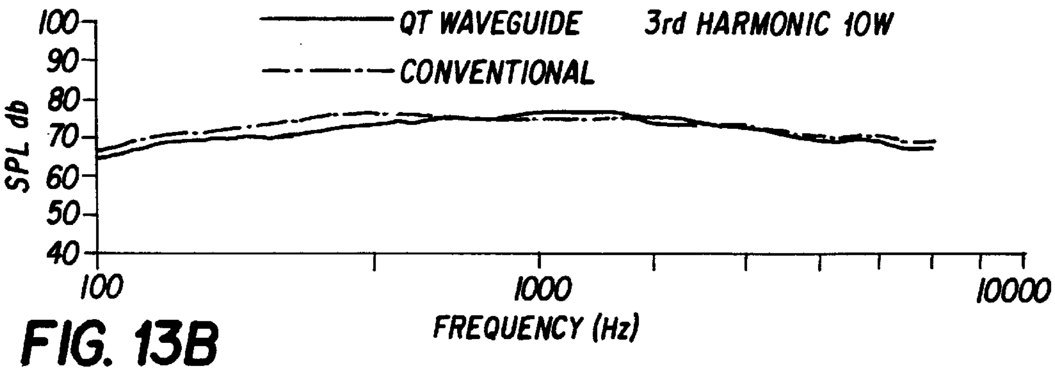
Figure 13C:
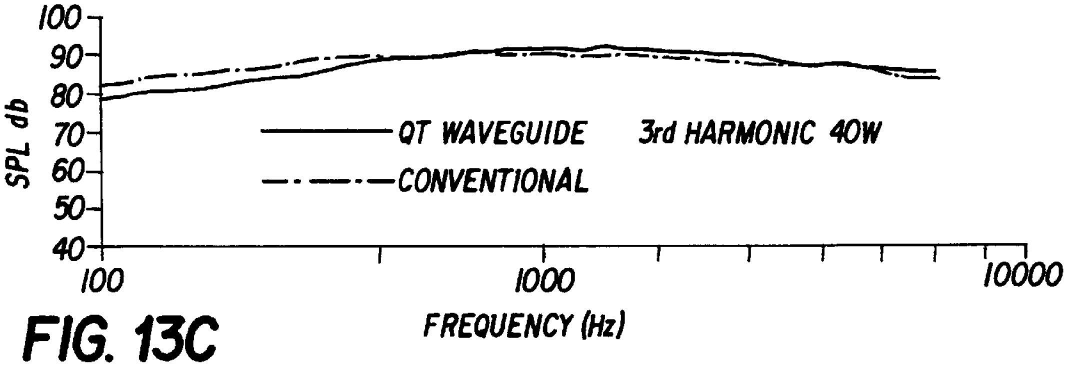

FIGS. 10A–B show the amplitude response of the two large throat entry devices respectively. The QT waveguide has an increase in the on-axis output above 5 kHz. At least part of this is attributable to the horizontal directivity in the same frequency region, shown in FIGS. 11A–B. The horn energy of the conventional design is spread over a wider beamwidth above 5 kHz. The $2^{nd}$ harmonic distortion graphs in FIGS. 12A–C show no real difference in the two devices. The QT waveguide has an average of 0.16 dB less to 0.4 dB more distortion than the conventional horn. FIGS. 13A–C reveals an overall decrease in the $3^{rd}$ harmonic distortion of the QT waveguide.

In the larger entry devices, the throat energy is larger for the conventional design. Accordingly, one would expect that its distortion would be lower. However, due to the fact that its distortion is marginally lower ($2^{nd}$) to significantly higher ($3^{rd}$) it is assumed that, had the throat entry sizes been equal, the same amount of reduction in distortion would have been realized as that of the 0.875" entry devices.

It can be seen that the Quadratic Throat waveguide has a large reduction of $3^{rd}$ harmonic distortion, while having a significant, yet smaller, reduction of $2^{nd}$ harmonic distortion when compared to a conical horn or a conventional constant directivity horn comprised of an exponential section followed by a conical section.

Due to the design of the throat section, the waveguide of the invention admits and propagates a one-parameter wave when it is driven at its throat entry 14 by a planar wave WP. The astigmatism typically found in conventional horns is eliminated in this waveguide of the invention. This has a definite advantage when multiple horns are employed in an array as the apparent point of origin of the wavefront is in the same place for any given orientation of the waveguide. This feature makes spatial alignment of the individual elements in the array much easier. Once placed in the array, these waveguides may be rotated, pitched or yawed as needed without affecting the spatial orientation of the wavefront, as it is truly spherical. With conventional horns, a change in orientation results in a change in the orientation of the wavefront curvature, as it is not spherical.

While there have been provided what are considered to be exemplary embodiments of the invention, it will be apparent to those skilled in the art that various changes and modifications therein may be made without departing from the invention, and it is intended in the appended claims to cover such changes and modifications as fall within the true spirit and scope of the invention.

What is claimed is:

1. A horn for a loudspeaker having a throat entry and exit comprising: a straight wall section having diverging sidewalls terminating at the exit; and a curved wall connecting section connected to the straight wall section having a proximal end perpendicular to the throat entry, said connecting section being coupled to the straight wall section at a point tangent thereto, and wherein said diverging sidewalls define at least one coverage angle in orthogonal planes having a common apex in the plane of the throat entrance.

2. The horn of claim 1 wherein the connecting section is arcuate.

3. The horn of claim 1 wherein the connecting section is formed of an arc of a circle.

4. A loudspeaker having a throat entry and exit comprising: a driver; and a horn connected to the driver at the throat entry, said horn having diverging straight wall sections terminating at the exit; and a curved wall connection section connected to the straight wall section having a proximal end perpendicular to the throat entry, said connecting portion being coupled to the straight sidewall section at a point tangent thereto, and wherein said diverging sidewall section define at least one coverage angle in orthogonal planes having a common apex in the plane of the throat entry.

5. The loudspeaker of claim 4 wherein the connection section is in the shape of an arc of a circle.

6. The loudspeaker of claim 5 wherein the driver produces a wavefront at the throat entry, which wavefront propagates through the horn such that end portions of the wavefront are perpendicular to the diverging sidewalls.

7. The loudspeaker of claim 5 wherein the straight wall portion comprises first opposite sidewalls disposed at an angle defining coverage angle in a first direction and second opposite sidewalls joining the first sidewalls disposed at an angle forming a second coverage angle in a direction perpendicular to the first direction.

8. The loudspeaker of claim 7 wherein the coverage angles share a common apex in the plane of the throat entry.

9. The loudspeaker of claim 5 wherein the throat entrance is circular.

10. The loudspeaker of claim 5 wherein the connecting wall portion has a circular cross section at the throat entrance and a cross section corresponding to the shape of the straight wall portion.

11. The loudspeaker of claim 5 wherein the horn has a circular cross section at the throat entrance and a truncated elliptical cross section between the straight wall portion and the throat entry.

12. The loudspeaker of claim 5 wherein the horn has a characteristic of a quadratic equation.

* * * * *